(12) United States Patent
Linstadt

(10) Patent No.: US 11,836,044 B2
(45) Date of Patent: *Dec. 5, 2023

(54) ERROR COALESCING

(71) Applicant: Rambus Inc., San Jose, CA (US)

(72) Inventor: John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/070,732

(22) Filed: Nov. 29, 2022

(65) Prior Publication Data

US 2023/0161668 A1    May 25, 2023

Related U.S. Application Data

(63) Continuation of application No. 17/363,622, filed on Jun. 30, 2021, now Pat. No. 11,544,145, which is a continuation of application No. 16/870,587, filed on May 8, 2020, now Pat. No. 11,080,137.

(60) Provisional application No. 62/845,762, filed on May 9, 2019.

(51) Int. Cl.
*G06F 11/00* (2006.01)
*G06F 11/10* (2006.01)

(52) U.S. Cl.
CPC ............... *G06F 11/1076* (2013.01)

(58) Field of Classification Search
CPC ................................................ G06F 11/1076
See application file for complete search history.

(56) References Cited

U.S. PATENT DOCUMENTS

| | | |
|---|---|---|
| 5,898,698 A | 4/1999 | Bross |
| 8,078,943 B1 | 12/2011 | Lee |
| 8,276,047 B2 | 9/2012 | Coe |
| 9,088,303 B2 | 7/2015 | Larsen et al. |
| 2010/0271929 A1 | 10/2010 | Yue et al. |
| 2015/0095601 A1* | 4/2015 | Muralimanhar .... G06F 12/0223 711/163 |
| 2015/0222291 A1 | 8/2015 | Kokubun et al. |
| 2018/0053545 A1 | 2/2018 | Son |
| 2018/0076926 A1 | 3/2018 | Zhang et al. |
| 2018/0091172 A1 | 3/2018 | Ilani et al. |
| 2018/0226999 A1 | 8/2018 | Wang et al. |
| 2018/0287632 A1* | 10/2018 | Rom ..................... G06F 3/0688 |
| 2018/0287634 A1 | 10/2018 | Rom et al. |
| 2018/0287636 A1 | 10/2018 | Rom et al. |

(Continued)

*Primary Examiner* — Mujtaba M Chaudry
(74) *Attorney, Agent, or Firm* — The Neudeck Law Firm, LLC

(57) ABSTRACT

A programmable crossbar matrix or an array of steering multiplexors (MUXs) coalesces (i.e., routes) the data values from multiple known "bad" bit positions within multiple symbols of a codeword, to bit positions within a single codeword symbol. The single codeword symbol receiving the known "bad" bit positions may correspond to a check symbol (vs. a data symbol). Configuration of the routing logic may occur at boot or initialization time. The configuration of the routing logic may be based upon error mapping information retrieved from system non-volatile memory (e.g., memory module serial presence detect information), or from memory tests performed during initialization. The configuration of the routing logic may be changed on a per-rank basis.

20 Claims, 12 Drawing Sheets

(56) References Cited

U.S. PATENT DOCUMENTS

2019/0036550 A1   1/2019  Koike-Akino
2019/0121692 A1   4/2019  Berger et al.
2019/0121693 A1   4/2019  Berger et al.
2019/0121694 A1   4/2019  Berger et al.
2019/0122746 A1   4/2019  Berger et al.
2019/0188078 A1   6/2019  Yu et al.

\* cited by examiner

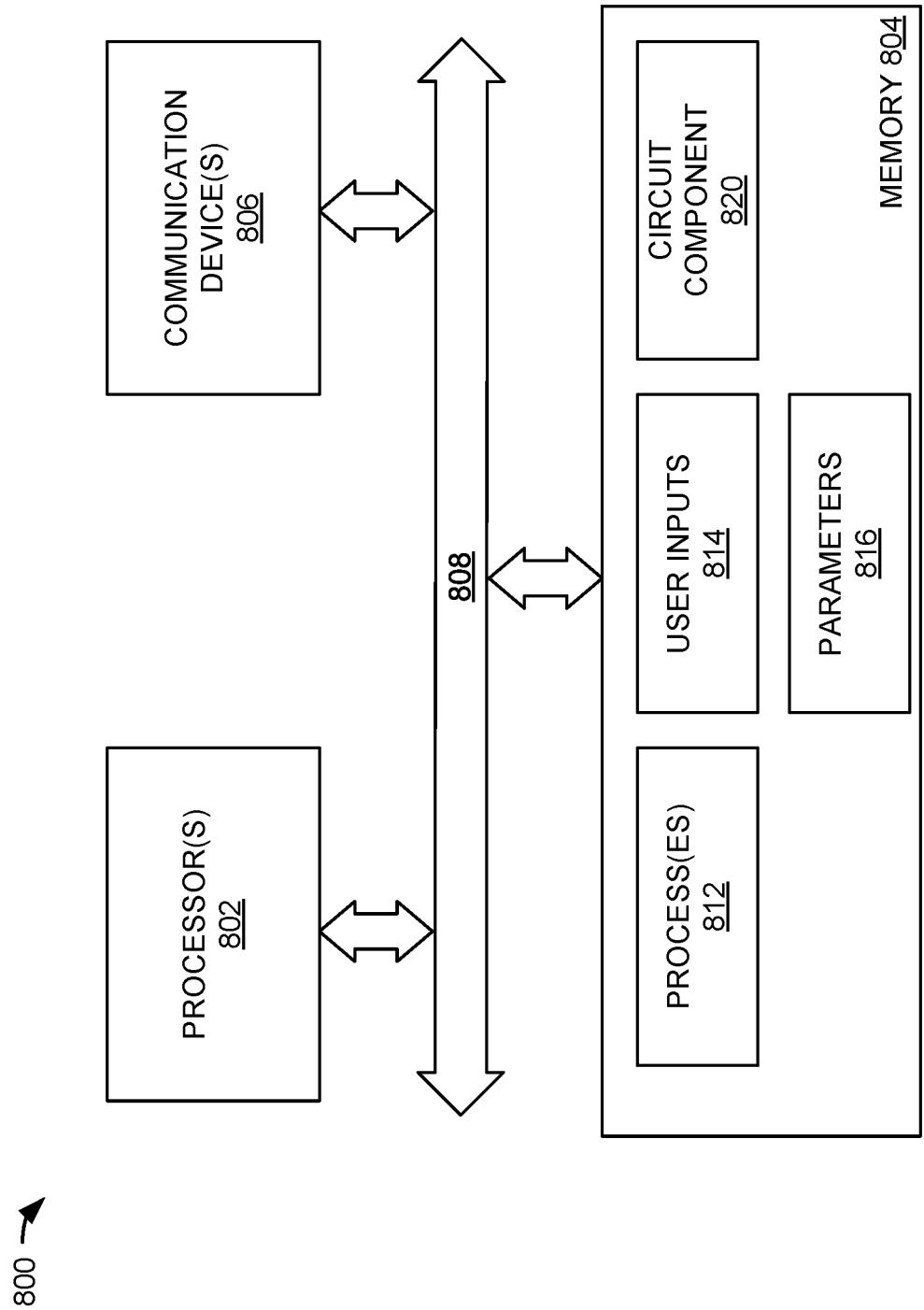

ERROR COALESCING

BRIEF DESCRIPTION OF THE DRAWINGS

FIG. 8 is a block diagram of a processing system.

DETAILED DESCRIPTION OF THE EMBODIMENTS

The presence and prevalence of random bit errors in memories negatively impacts the robustness and availability of computer systems. In an embodiment, a programmable crossbar matrix or an array of steering multiplexors (MUXs) coalesces (i.e., routes) the data from multiple known "bad" bit positions within multiple symbols of a codeword to bit positions within a single codeword symbol. In an embodiment, the single codeword symbol receiving the values of the known "bad" bit positions corresponds to a check symbol (vs. a data symbol).

Configuration of the routing logic may occur at boot or initialization time. The configuration of the routing logic may be based upon error mapping information retrieved from system non-volatile memory (e.g., memory module serial presence detect information), or from memory tests performed during initialization. The configuration of the routing logic may be changed on a per-rank basis. In an embodiment, a full N-to-N crossbar matrix or steering MUXs are disposed entirely in the memory controller. In another embodiment, the steering logic/function may be distributed between the memory controller, data buffers (if any), and/or memory devices.

Figure 1:
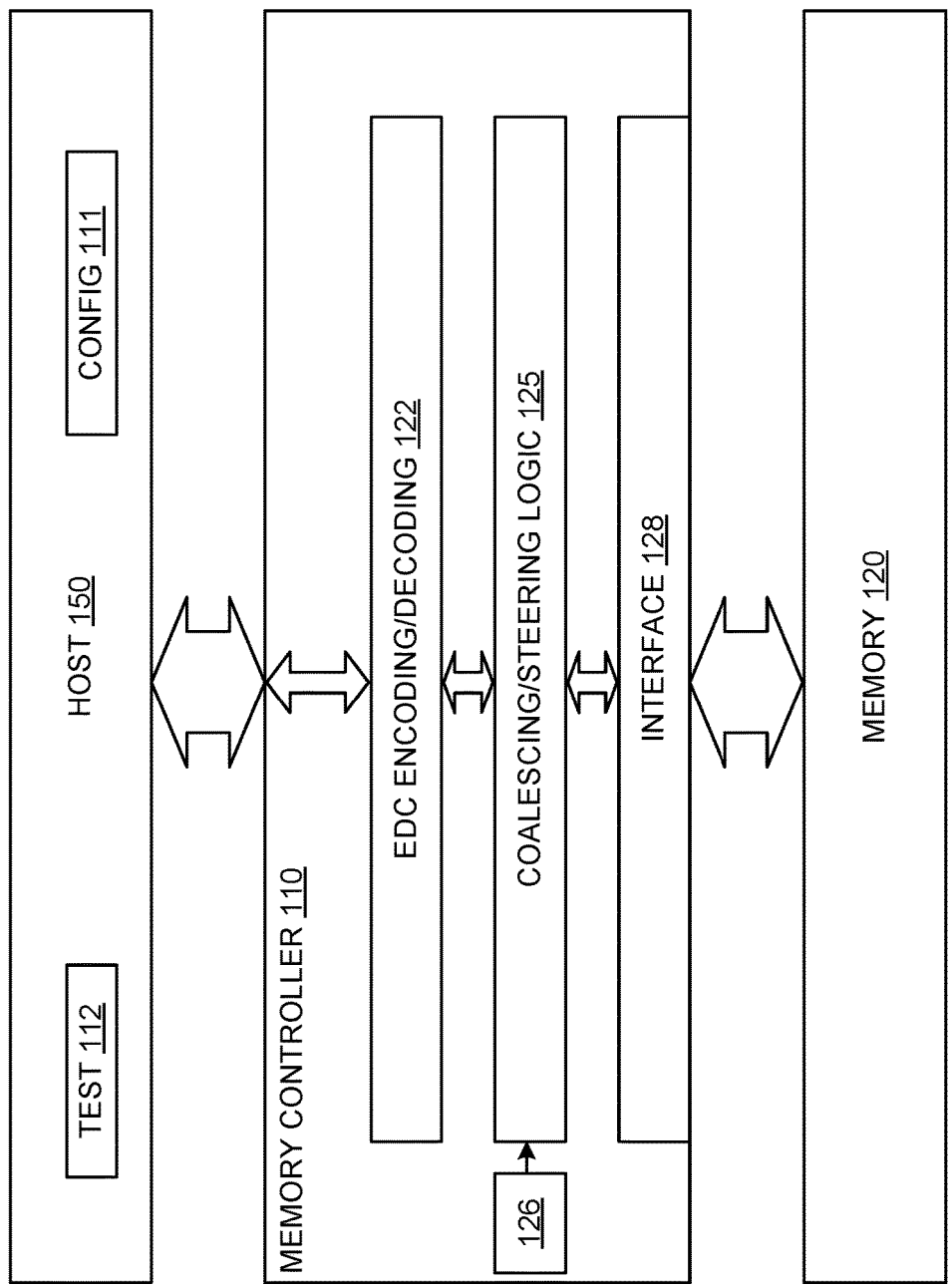
FIG. 1 is a block diagram illustrating a memory system.

FIG. 1 is a block diagram illustrating a memory system. In FIG. 1, memory system 100 comprises a memory controller 110, memory 120, and a host 150. Memory controller 110 includes error detect and correct (EDC) circuitry 122, coalescing/steering logic 125, configuration circuitry 126, and interface 128. Host 150 may store configuration information 111 and/or memory test result information 112. Host 150 is operatively coupled to memory controller 110. Memory controller 110 is operatively coupled to memory 120.

Controller 110 and memory component 120 may be integrated circuit type devices, such as are commonly referred to as a "chips". A memory controller, such as controller 120, manages the flow of data going to and from memory devices and/or memory modules. Memory component 120 (also referred to as memory 120) may be a standalone device, may be a component of a memory module, or may be a memory module. A memory controller can be a separate, standalone chip, or integrated into another chip. For example, a memory controller may be included on a single die with a microprocessor (e.g., host 150), or included as part of a more complex integrated circuit system such as a block of a system on a chip (SOC).

Memory 120 can include a dynamic random access memory (DRAM) core or other type of memory cores, for example, static random access memory (SRAM) cores, or non-volatile memory cores such as flash. Controller 110 and memory 120 may be interconnected with each other in a variety of system topologies including on a PC board (e.g., where the memory is on a module and the controller is socketed to the PC board, or in "die-down" arrangement where one or both of the chips are soldered to the PC board), stacked one on top of another and encapsulated in a single package or each having separate package (package-on-package), both disposed on a shared substrate, on an interposer, or even in a direct-attach arrangement.

As used herein, the terms related to error correction (e.g., EDC, EDC code, ECC, ECC code, check bits, check symbols, etc.) refer broadly to the generation and/or addition of redundancy (i.e., some extra data) to data, which can be used (e.g., by EDC circuitry 122) to check the consistency of retrieved data, and/or to recover data that has been determined to be corrupted. Thus, at least the terms EDC information and EDC code should be understood to include redundant information that merely checks for corruption (e.g., parity so that retrieval may be retried) as well as more complex error detection/correction schemes such as checksums, cyclic redundancy checks (CRC—e.g., CRC-8), and forward error correction schemes (e.g., BCH codes, Reed-Solomon codes, Galois Field parity (e.g., Chipkill), etc.)

In an embodiment, host 150 provides controller 110 with a data block (e.g., 256 bits) to be stored in memory 120. EDC circuitry 122 generates one or more check symbols (e.g., four 8-bit check symbols) based on the data in the data block. The data block and the check symbols form a codeword having data symbols and check symbols. The data symbols correspond to selected bits in the codewords using a mapping of bit locations to data symbol fields. The check symbols correspond to other selected bits in the codewords using a mapping of bit locations to check symbol fields.

For example, a codeword may be arranged such that bits numbered 0 through 7 correspond to a first data symbol, bits numbered 8 through 15 a second data symbol, and so on with bits 247 to 255 corresponding to a $32^{nd}$ data symbol. The arrangement may then continue with bits numbered 256 to 263 corresponding to a first check symbol, bits numbered 264 through 271 a second check symbol, and so on with bits 279 to 287 corresponding to a fourth check symbol.

The codeword is passed to coalescing logic 125. Configuration circuitry 126 controls coalescing logic 125 to swap one or more bits of the codeword. In particular, coalescing logic 125 swaps one or more bits that meet at least one unreliability criteria with other bits (e.g., bits that meet a reliability criteria.) Examples of unreliability criteria that may be met include: a memory location in memory 120 that is read/written using the bit location is 'stuck at' a zero or one, a memory location that is read/written using the bit location exhibits a bit error rate that exceeds a threshold, etc. Configuration information 111 and/or memory test result information 112 may be used to determine which bit positions will be selected to be swapped. In an embodiment, bit positions that are in a single check symbol are swapped with bit positions corresponding that are in multiple data symbols. This swapping forms a second 'coalesced' codeword that is written to memory 120 by interface 128.

It should be understood that, in an embodiment, there may be two coalescing logic blocks—one for read operations and one for write operations. However, for the sake of brevity, the Figures illustrate a single coalescing logic block that both rearranges and restores the bit positions (e.g., by swapping one or more bits with each other.)

The configuration of coalescing logic 125 may occur at boot or initialization time. In an embodiment, the configuration of coalescing logic 125 may be based upon error mapping information retrieved from system non-volatile memory (e.g., memory module serial presence detect information), or from memory tests performed during initialization. The configuration of coalescing logic 125 may be changed on a per-rank basis. In an embodiment, coalescing logic 125 may comprise a full N-to-N crossbar matrix. In an embodiment, coalescing logic 125 may comprise steering MUXs.

When the coalesced codeword is retrieved from memory 120, interface 128 provides the retrieved codeword to coalescing logic 125 to 'undo' the swapping. By undoing the swapping, each of the swapped bits in the codeword are restored to their original location in the data symbols fields and check symbol fields of the original codeword. This restored codeword may then be checked and/or corrected by EDC logic 122. After being checked and/or corrected, the retrieved data block may be passed to host 150 by controller 110.

Figure 2A:
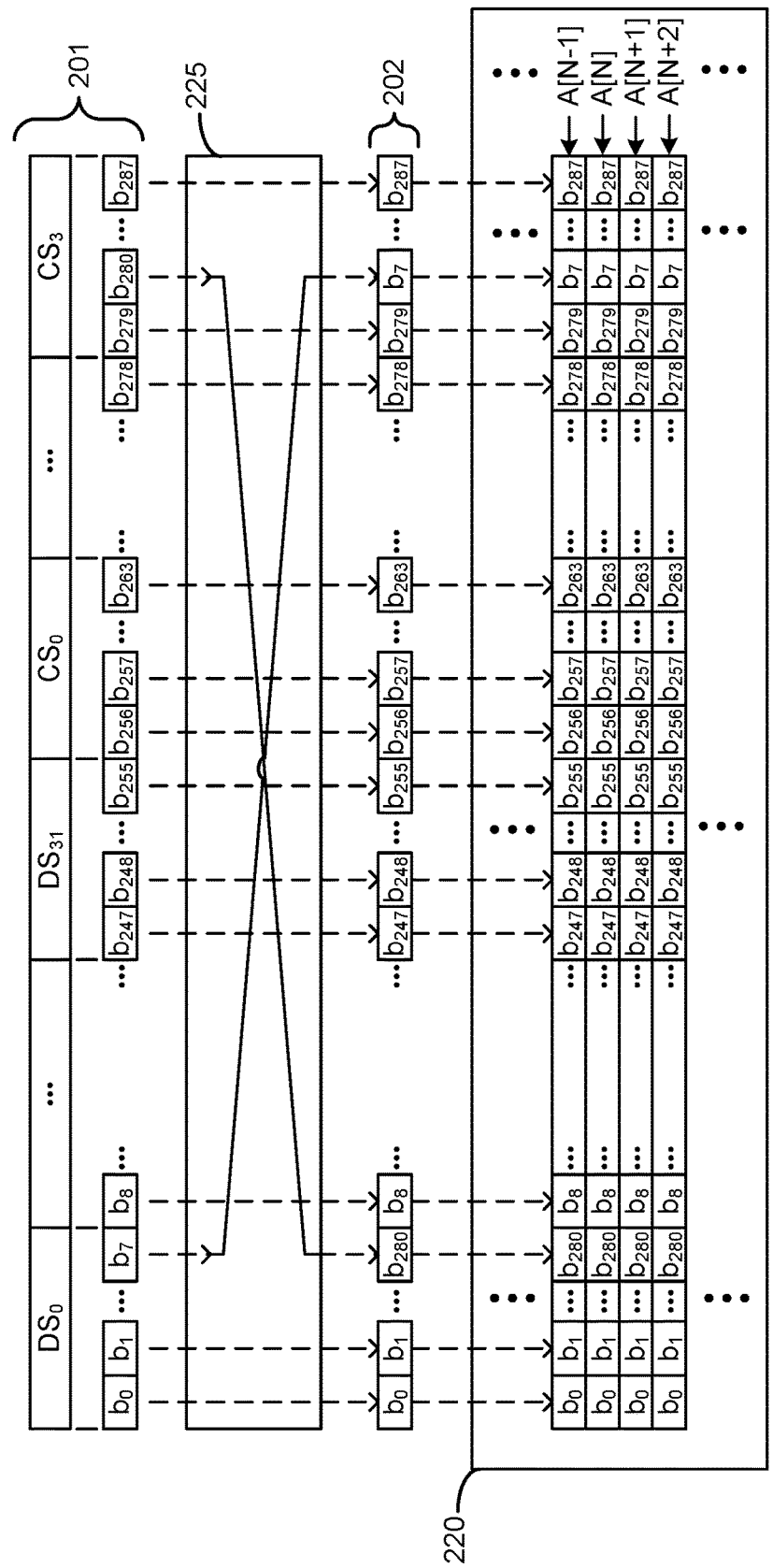
FIGS. 2A-2E are diagrams illustrating error coalescing.

FIGS. 2A-2E are diagrams illustrating error coalescing. In FIG. 2A error coalescing system 200 includes codeword 201, coalescing circuitry 225, codeword 202, and memory 220. In FIG. 2A, codeword 201 is composed of 288 bits labeled $b_0$ to $b_{287}$. These bits are grouped into 32 8-bit data symbol fields and four 8-bit check symbol fields—labeled $DS_0$ to $DS_{31}$ and $CS_0$ to $CS_3$, respectively. In FIGS. 2A-2E, $DS_0$ is composed of bits $b_0$-$b_7$; $DS_1$ is composed of bits $b_8$-$b_{15}$, and so on. $CS_0$ is composed of bits $b_{256}$-$b_{263}$; CS1 is composed of bits $b_{264}$-$b_{271}$, and so on. Other numbers of bits per codeword, and other arrangements of bit positions to symbols may be used. Coalescing circuitry 225 produces codeword 202 from codeword 201 by swapping (or otherwise re-arranging) one or more bits of codeword 201.

In FIG. 2A, coalescing system 200, and coalescing circuitry 225 in particular, are illustrated as configured to swap bit $b_7$ in $DS_0$ with bit $b_{280}$ in $CS_3$ in codeword 201 to produce codeword 202. Thus, for example, if bit $b_7$ has been determined to meet an unreliability threshold when stored and retrieved from memory 220, coalescing circuitry 225 swaps (exchanges) the bit value of $b_7$ in codeword 201 with the bit value of $b_{280}$ in codeword 201 before coalescing system 200 stores codeword 202 to memory 220. This places the bit value (i.e., $bit_{280}$) from a check symbol (i.e., $CS_3$) into the unreliable bit position ($b_7$), when stored to memory 220, rather than a bit value from a data symbol (i.e., the 'old' $b_7$). Although only two bits are being swapped in FIG. 2A, multiple unreliable bits may be swapped into $CS_3$. In this manner, the unreliability associated with multiple bits (and/or symbols) may be concentrated (coalesced) into a single symbol (when retrieved).

Figure 2B:
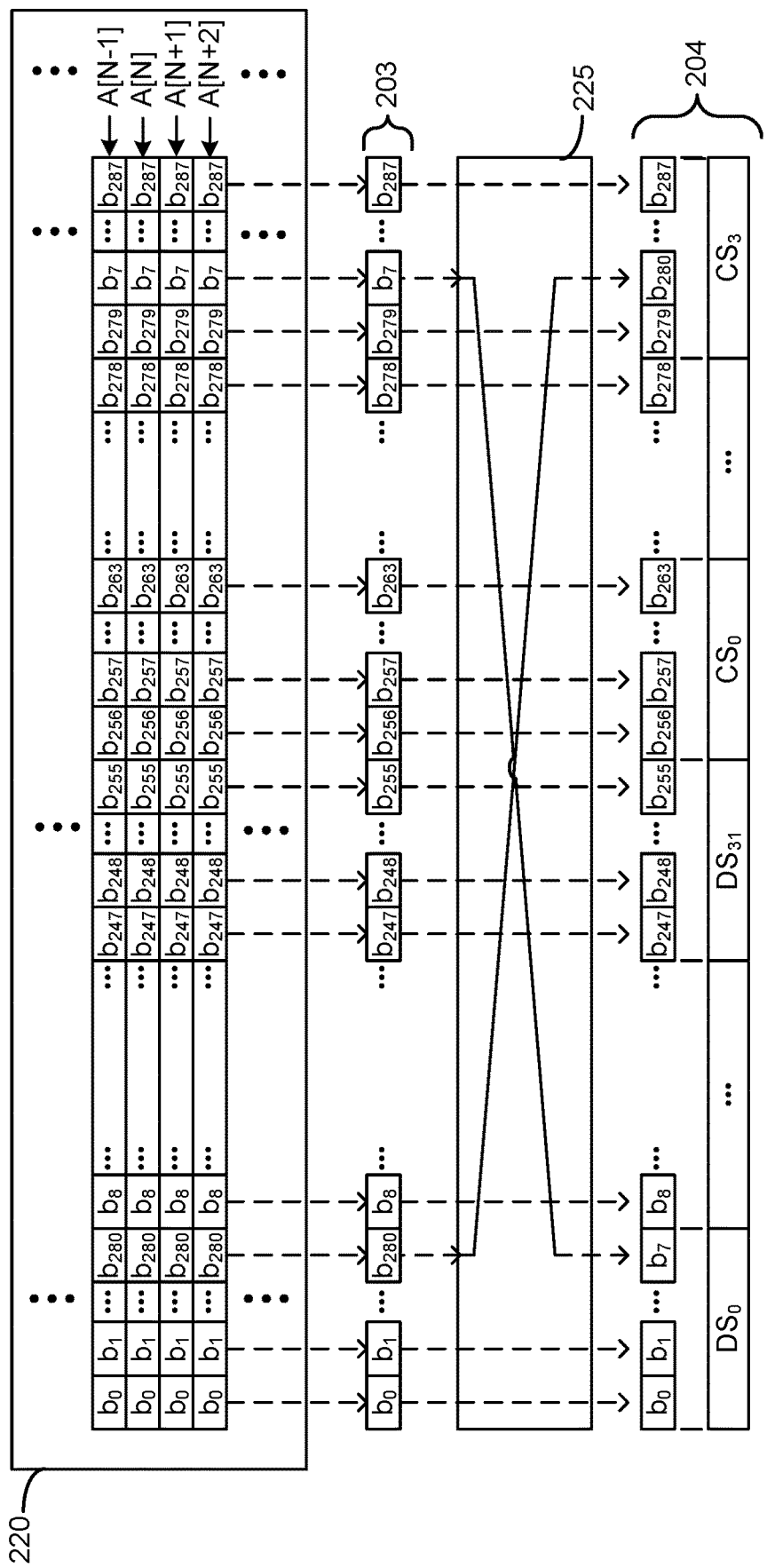

In FIG. 2B, coalescing system 200, and coalescing circuitry 225 in particular, are illustrated as configured to swap the relocated bit $b_7$ in codeword 203 (which was retrieved from memory 220 and therefore may have errors) with the relocated bit $b_{280}$. This produces codeword 204 with bits $b_7$ and $b_{280}$ located in their correct symbols and bit locations of $DS_0$ and $CS_3$, respectively.

Figure 2C:
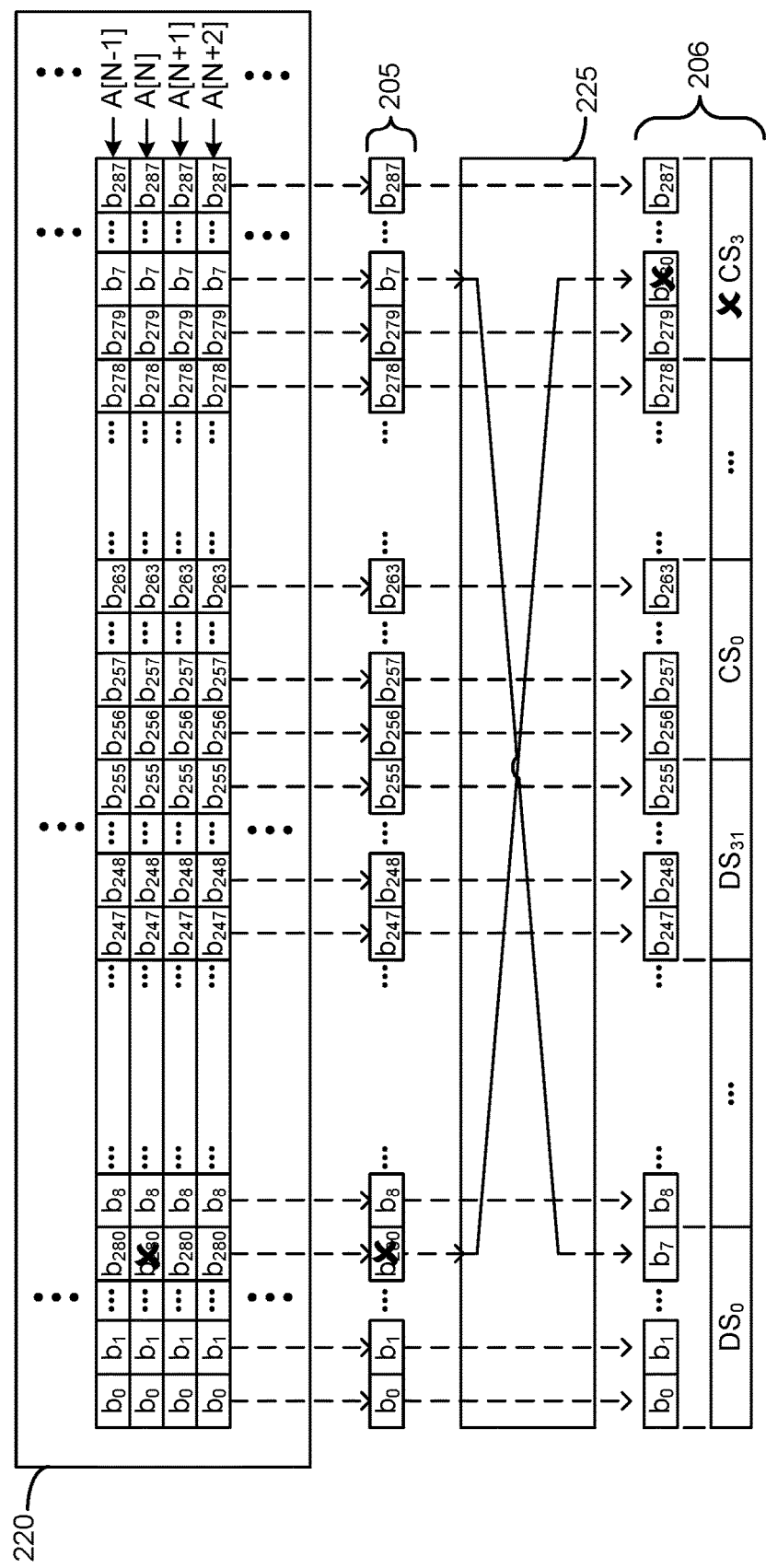

FIG. 2C further illustrates how the unreliability of a bit is relocated to a check symbol. Before storing coalescing system 200 swaps (exchanges) the bit value of $b_7$ in codeword 201 with the bit value of $b_{280}$ in codeword 201 before coalescing system 200 stores codeword 202 to memory 220 at all addresses A[ ]. Thus, in FIG. 2C, the values of bit $b_{280}$ in memory 220 are illustrated adjacent to the values for bit $b_8$. Likewise, the values of bit $b_7$ in memory 220 are illustrated adjacent to the values for bit $b_{279}$.

In FIG. 2C, bit position $b_7$ has been determined to meet an unreliability threshold. The example unreliability depicted in FIG. 2C is a bad bit at location $b_7$ of address A[N]. Thus, in FIG. 2C, the value at address A[N] in memory 220 for bit $b_{280}$ (which is now in position $b_7$) has an "X" over it. When address A[N] is read, codeword 205 is produced and input to coalescing circuitry 225. Coalescing circuitry 225 swaps the relocated bit $b_7$ in codeword 205 with the (now unreliable) relocated bit value $b_{280}$. This produces codeword 206 with bits $b_7$ and $b_{280}$ located in their correct symbols of $DS_0$ and $CS_3$, respectively—where the unreliability of the restored bit value $b_{280}$ is illustrated by the "X" over bit $b_{280}$ and the "X" in $CS_3$.

Figure 2D:
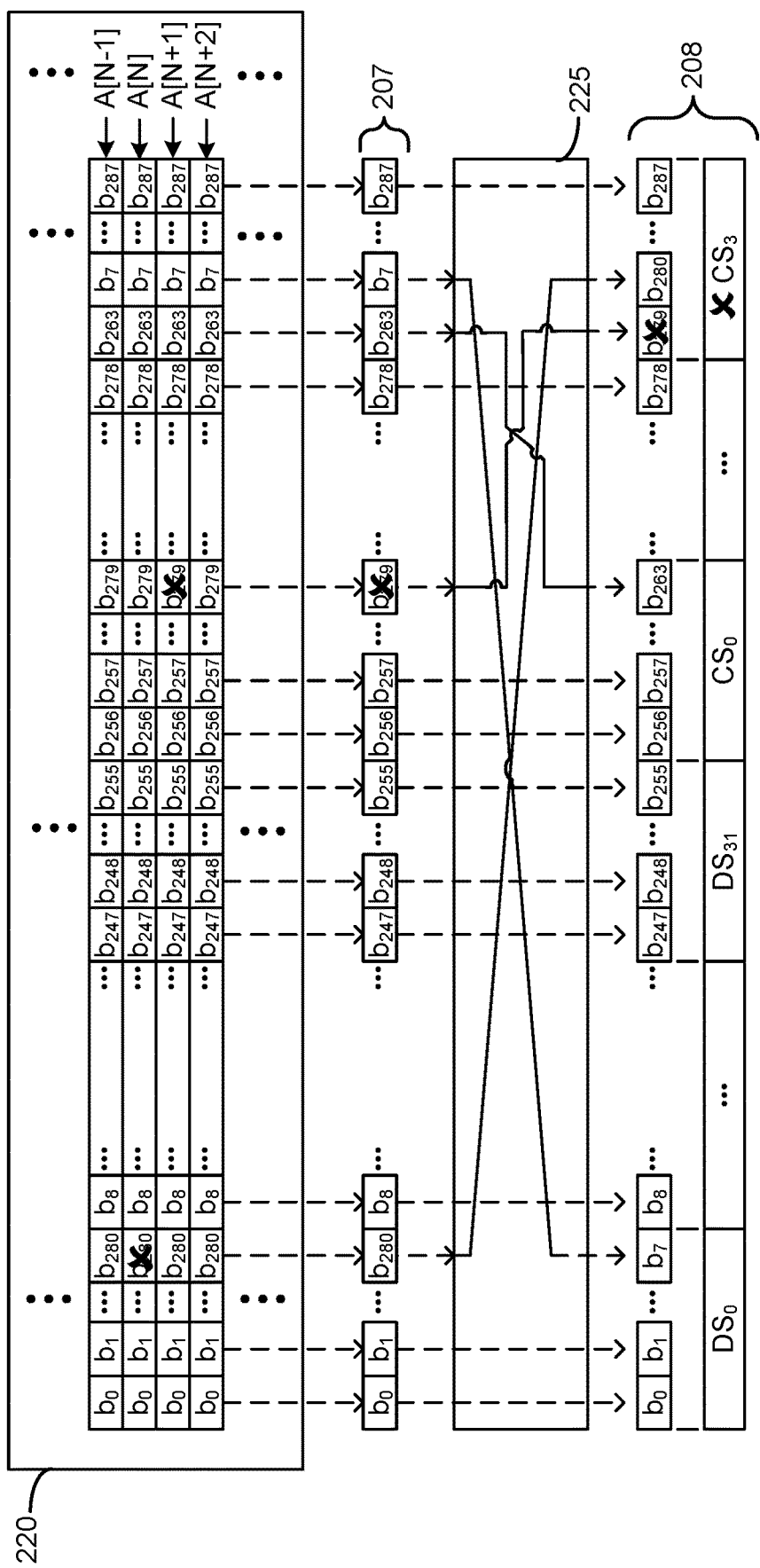

FIG. 2D illustrates how the unreliability of multiple bits at the same memory address are relocated to a check symbol. Before storing, coalescing system 200 swaps (at all addresses A[ ]) the bit values of $b_7$ with the bit value of $b_{280}$ and the bit values of $b_{279}$ with the bit values of $b_{273}$ before coalescing system 200 stores codewords to memory 220. Bit position $b_7$ has been determined to meet an unreliability threshold. The example unreliability depicted in FIG. 2D is a bad bit at location $b_7$ of address A[N]. Thus, in FIG. 2D, the value at address A[N] in memory 220 for bit $b_{280}$ (which is now in position $b_7$) has an "X" over it. Likewise, Bit position $b_{279}$ has been determined to meet an unreliability threshold. Thus, in FIG. 2D, the value at address A[N+1] in memory 220 for bit $b_{280}$ (which is now in position $b_7$) has an "X" over it.

When address A[N+1] is read, codeword 207 is produced and input to coalescing circuitry 225. Coalescing circuitry 225 swaps the relocated bits $b_7$, $b_{263}$, $b_{279}$, and $b_{280}$ in codeword 207 with their respective counterparts. This produces codeword 208 with bits $b_7$, $b_{263}$, $b_{279}$, and $b_{280}$ located in their correct symbols. The unreliability of the restored bit value $b_{279}$ is illustrated by the "X" over bit $b_{279}$ and the "X" in $CS_3$. Note that because of the nature of the unreliability of bit $b_7$ (i.e., only occurs at address A[N]), the "X" over bit $b_{280}$ does not translate to codeword 208 (because address A[N+1] was being retrieved.) However, check symbol $CS_3$ is still unreliable due to the unreliability of bit $b_{279}$. In this example, the second unreliable bit, $b_{279}$, is in check symbol CS0. However, this is to briefly illustrate that unreliable bits can come from both data symbols and check symbols. The second unreliable bit can come from a data symbol.

Figure 2E:
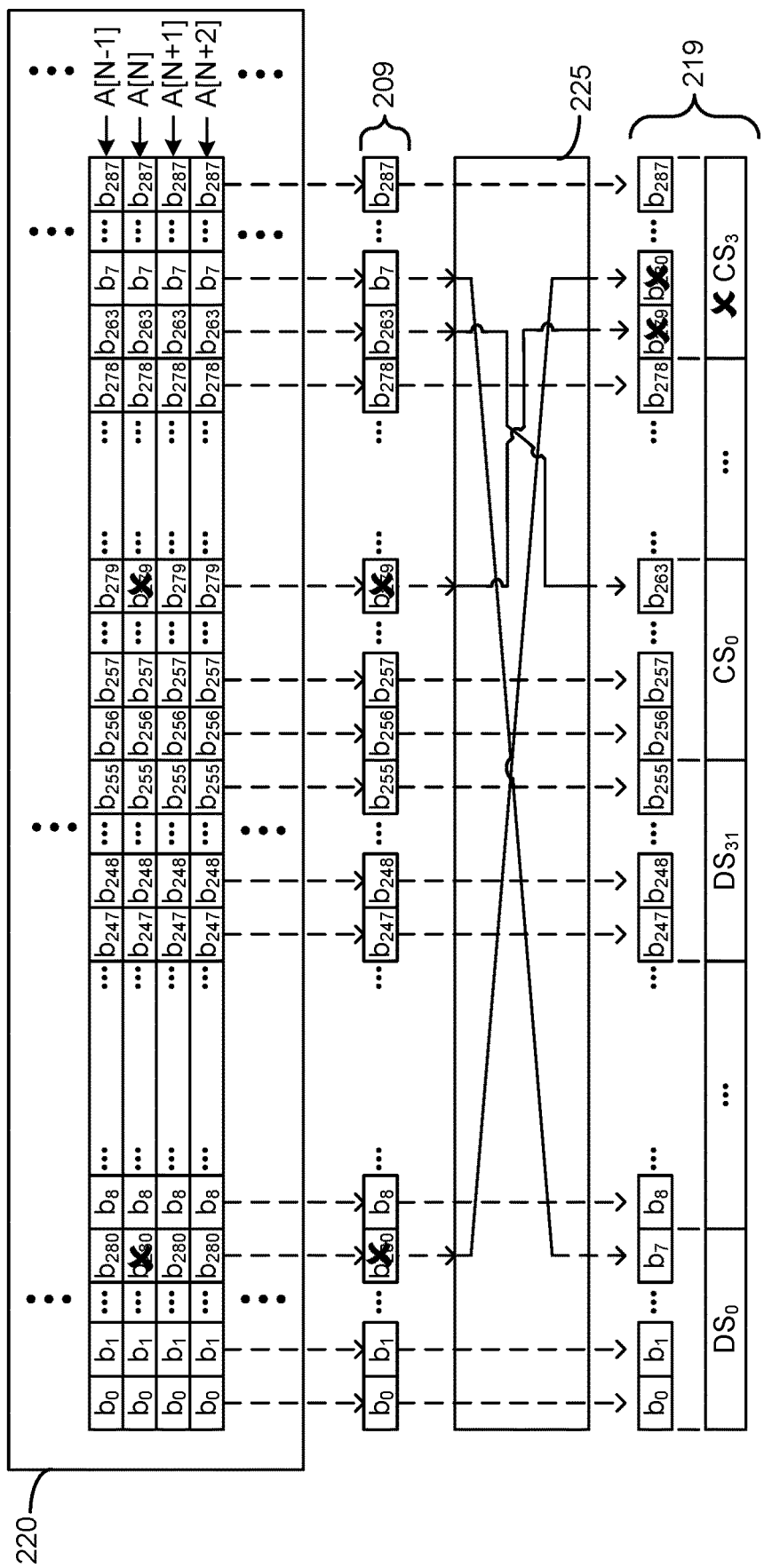

FIG. 2E illustrates how the unreliability of multiple bits are relocated to a check symbol. Before storing coalescing system 200 swaps (at all addresses A[ ]) the bit values of b7 with the bit value of b280 and the bit values of b279 with the bit values of b273 before coalescing system 200 stores codewords to memory 220. Bit positions b7 and b279 have been determined to meet an unreliability threshold. The example unreliability depicted in FIG. 2D are bad bits at location b7 and b279 of address A[N]. Thus, in FIG. 2E, the values at address A[N] in memory 220 for bit b280 (which is now in position b7) and for bit b279 (which is now in position b263) have an "X"'s over them.

When address A[N] is read, codeword 209 is produced and input to coalescing circuitry 225. Coalescing circuitry 225 swaps the relocated bits b7, b263, b279, and b280 in codeword 209 with their respective counterparts. This produces codeword 219 with bits b7, b263, b279, and b280 located in their correct symbols. The unreliability of the restored bit values b279 and b280 are illustrated by the "X" over bits b279 and b280. The unreliability of these two bits is also illustrated by the "X" in CS3. In this example, the second unreliable bit, b279, is in check symbol CS0. However, this is to briefly illustrate that unreliable bits can come from both data symbols and check symbols. The second unreliable bit can come from a data symbol.

For certain EDC coding schemes (e.g., RS codes), multiple single-bit errors in the same symbol are not harder to detect and correct than a single bit error in that symbol (a.k.a., symbol based EDC codes). In other words, it does not matter to the code how many bits in a symbol are in error—if multiple bits in a symbol are corrupted, it only counts as a single error. Thus, placing as many unreliable bit positions into the same symbol improves the ability to detect and correct errors when compared to leaving unreliable bits in their original bit positions.

In an embodiment, since the unreliable (or 'bad') bits are all placed in the same symbol, that symbol may be, for the purposes of error detection and or correction, always considered an 'erasure.' In these codes, the number of correctable errors may be governed by the following equation: $2E+S \geq n-k$, where E is the number of symbols with errors (error symbols), S is the number of erased symbols, n is the total number of symbols, and k is the number of data symbols (this may also be expressed as $t=n-k$, where t is the number of check symbols.) Thus, for the example codeword illustrated in FIGS. 2A-2E: n=36, k=32 and S=1 (for the know 'unreliable' symbol), then 1 symbol (with any number of bit errors) in addition to the erasure or 'known bad' symbol can be detected and corrected because $2*1+1 \geq 36-32=4$. In another example, (not shown in the Figures) a codeword may have n=39, k=32, and S=1. For this example, up to three additional symbols with errors can be detected and corrected because: $2*3+1 \geq 39-32=7$.

Figure 3:
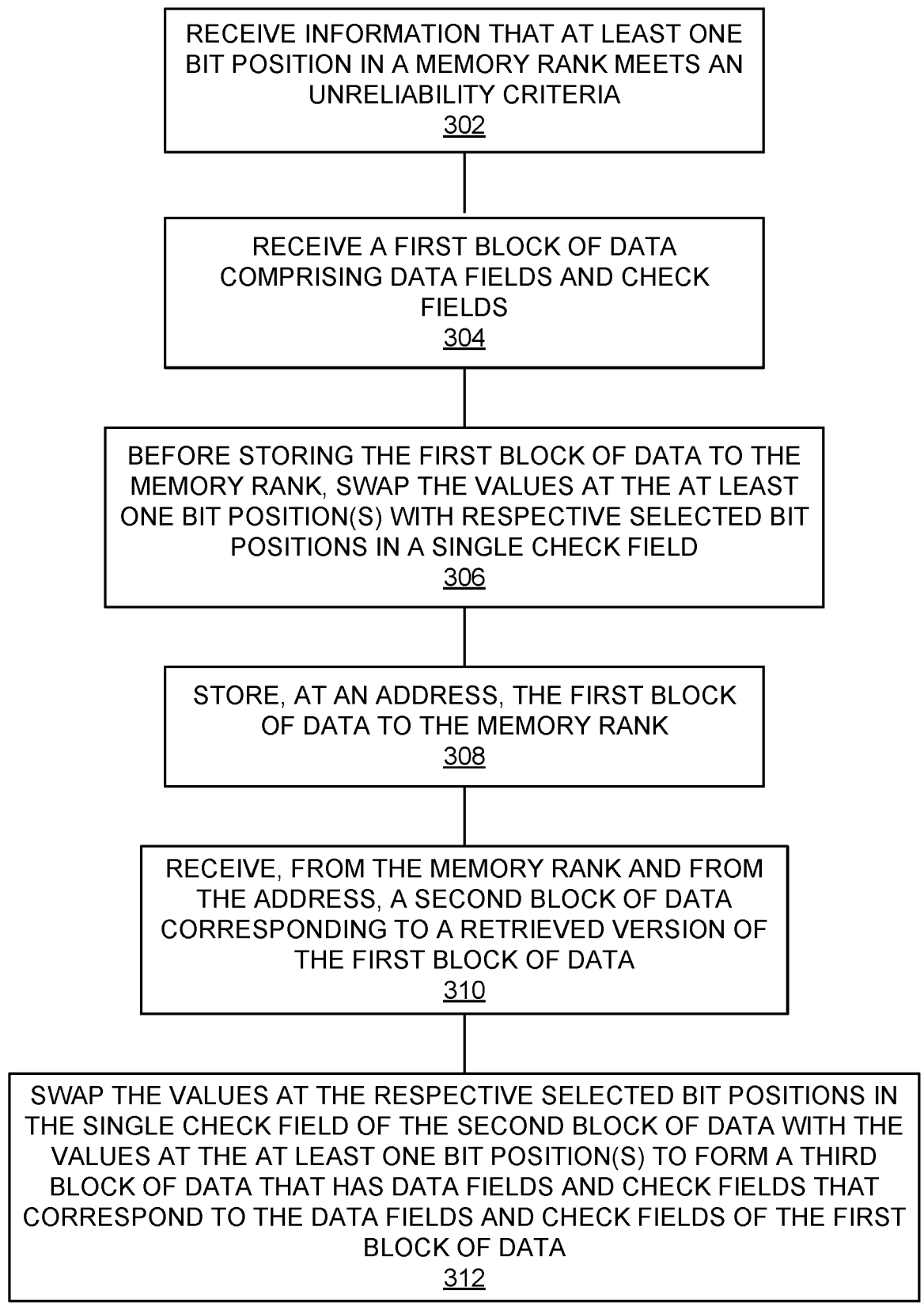
FIG. 3 is a flowchart illustrating a method operating a memory controller.

FIG. 3 is a flowchart illustrating a method operating a memory controller. The steps illustrated in FIG. 3 may be performed by, for example, one or more elements of system 100, and/or system 200. Information is received that at least one bit position in a memory rank meets an unreliability criteria (302). For example, host 150 and/or controller 110 may test memory 120 during initialization and determine that storage cells corresponding to one or more bit positions are unreliable and/or otherwise may fail to properly store data under expected operating conditions. In another example, host 150 may query memory 120 (e.g., using mode register set commands and/or using a serial presence detect channel) and receive information that indicates storage cells corresponding to one or more bit positions are unreliable and/or otherwise may fail to properly store data under expected operating conditions. In another example, the information may be in the form of host 150 and/or controller 110's control of configuration circuitry 126 to swap certain bits when reading and writing to memory 120 and/or a given rank of memory 120.

A first block of data comprising data fields and check fields is received (304). For example, EDC circuitry 122 may provide to coalescing logic 125 a codeword (e.g., codeword 201) that includes fields for data symbols (e.g., DS0-DS31) and fields for check symbols (e.g., CS0-CS3.) Before the first block of data is stored to the memory rank, the values at the at least one bit position(s) are swapped with respective selected bit positions in a single check field (306). For example, coalescing logic 125 may, before the codeword is stored, swap the values at one or more bit position(s) in the data symbol fields with the values at selected bit positions in a single check symbol field, where the bits positions in the data symbol fields correspond to one or more bit positions that have been determined (or have been deemed) to be unreliable. This swapping places the values of unreliable bit positions into the same symbol thereby improving the ability to detect and correct errors when compared to leaving unreliable bits in their original bit positions. In an embodiment, since the unreliable (or 'bad') bits are all placed in the same symbol, that symbol may be, for the purposes of error detection and or correction, always considered an 'erasure.'

The first block of data is stored to the memory rank (308). For example, coalescing logic 125 may provide interface 128 with the re-arranged (but still containing the same information) codeword for storage to memory 120. From the memory rank and from the address, a second block of data corresponding to a retrieved version of the first block of data is received (310). For example, controller 110, using interface 128, may retrieve, from a given address the codeword it had previously stored to that given address. This retrieved version may have errors and therefore may not be the same as the originally stored codeword.

The values at the respective selected bit positions in the single check field of the second block of data are swapped with the values at the at least one bit position(s) to form a third block of data that has data fields and check fields that correspond to the data fields and check fields of the first block of data (312). For example, coalescing logic 125 may, swap the values at the values at the selected bit positions in the single check symbol field with the one or more bit position(s) in the data symbol fields that were previously swapped before being stored. The bit positions in the data symbol fields correspond to the one or more bit positions that have been determined (or have been deemed) to be unreliable. This restores the swapped bits to their original positions in the data symbol fields and check symbol fields so that EDC circuitry 122 may check and/or correct errors in the retrieved codeword.

Figure 4:
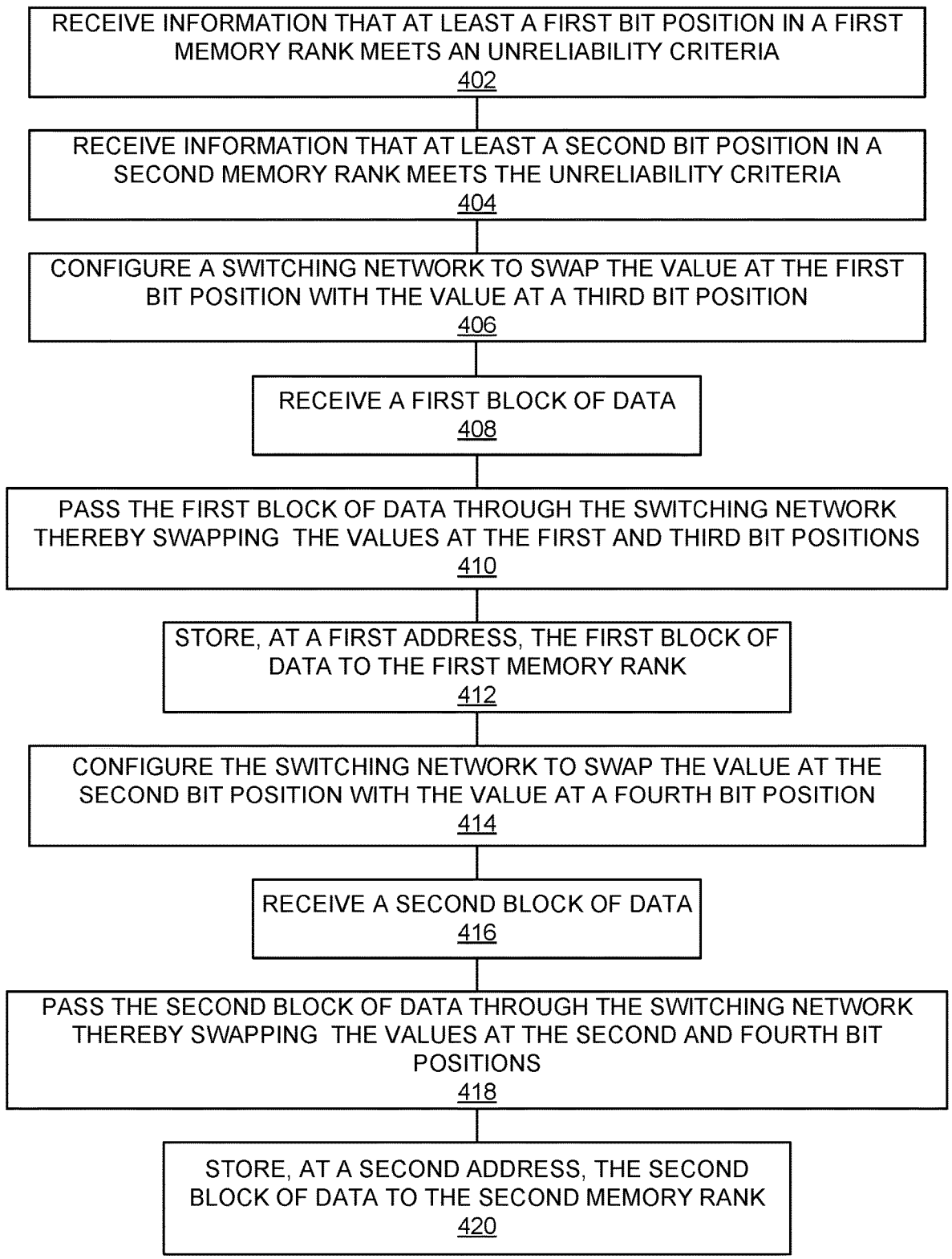
FIG. 4 is a flowchart illustrating a method of storing error coalescing codewords on a per rank basis.

FIG. 4 is a flowchart illustrating a method of storing error coalescing codewords on a per rank basis. The steps illustrated in FIG. 4 may be performed by, for example, one or more elements of system 100, and/or system 200. Information that at least a first bit position in a first memory rank meets an unreliability criteria is received (402). For example, host 150 and/or controller 110 may test a first rank of memory during initialization and determine that storage cells corresponding to a first set of bit position(s) are unreliable and/or otherwise may fail to properly store data under expected operating conditions. In another example, host 150 may query a first rank of memory (e.g., using mode register set commands and/or using a serial presence detect channel) and receive information that indicates storage cells corresponding to the first set of bit position(s) are unreliable and/or otherwise may fail to properly store data under expected operating conditions. In another example, the information may be in the form of host 150 and/or controller 110's control of configuration circuitry 126 to swap certain bits when reading and writing to memory 120 and/or a given rank of memory 120.

Information that at least a second bit position in a second memory rank meets the unreliability criteria is received (404). For example, host 150 and/or controller 110 may test a second rank of memory during initialization and determine that storage cells corresponding to a second set of bit position(s) are unreliable and/or otherwise may fail to properly store data under expected operating conditions. In another example, host 150 may query a second rank of memory (e.g., using mode register set commands and/or using a serial presence detect channel) and receive information that indicates storage cells corresponding to the second set of bit position(s) are unreliable and/or otherwise may fail to properly store data under expected operating conditions. In another example, host 150 and/or controller 110 may control configuration circuitry 126 to swap the second set of bit position(s) with other bit positions when reading and writing to a first rank of memory.

A switching network is configured to swap the value at the first bit position with the value at a third bit position (406). For example, when writing to a first rank of memory, coalescing logic 125 may be configured to swap the values at a first set of bit position(s) in the data symbol fields with the values at selected bit positions in a single check symbol field. The first set of bit position(s) in the data symbol fields may correspond to bit positions in the first rank that have been determined (or have been deemed) to be unreliable. This swapping of the values at the first set of bit position(s) places the values that are going to be stored in unreliable bit positions of the first rank into the same (e.g., check) symbol. This can improve the ability to detect and correct errors when compared to leaving values that otherwise would be stored in unreliable bit position(s) in their original (e.g., multiple data symbol) bit positions.

A first block of data is received (408). For example, coalescing logic 125 may receive, from EDC circuitry 122, a first codeword (e.g., codeword 201). The first block of data is passed through the switching network thereby swapping the values at the first and third bit positions (410). For example, the first codeword (e.g., codeword 201) may be passed through coalescing logic 125 to produce a first rearranged codeword (e.g., codeword 202) with the values at a first set of bit position(s) in the data symbol fields swapped with the values at selected bit positions in a single check symbol field.

At a first address, the first block of data is stored to the first memory rank (412). For example, the first rearranged codeword (e.g., codeword 202) may be stored to a first memory rank that has storage cells corresponding to the first set of bit position(s) that are unreliable and/or otherwise may fail to properly store data under expected operating conditions.

The switching network is configured to swap the value at the second bit position with the value at a fourth bit position (414). For example, when writing to a second rank of memory, coalescing logic 125 may be configured to swap the values at a second set of bit position(s) (which may be different, or the same as, the first set of bit positions) in the data symbol fields with the values at selected bit positions in the single check symbol field. The second set of bit position(s) in the data symbol fields may correspond to bit position(s) in the second rank that have been determined (or have been deemed) to be unreliable. This swapping of the values at the second set of bit positions places the values that are going to be stored in unreliable bit positions of the second rank into the same (e.g., check) symbol. This can improve the ability to detect and correct errors when compared to leaving values that otherwise would be stored in unreliable bit position in their original (e.g., multiple data symbol) bit positions.

A second block of data is received (416). For example, coalescing logic 125 may receive, from EDC circuitry 122, a second codeword. The second block of data is passed through the switching network thereby swapping the values at the second and fourth bit positions (418). For example, the second codeword may be passed through coalescing logic 125 to produce a rearranged second codeword with the values at a second set of bit position(s) in the data symbol fields swapped with the values at selected bit positions in the single check symbol field.

At a second address, the second block of data is stored to the second memory rank (420). For example, the rearranged second codeword may be stored to a second memory rank that has storage cells corresponding to the second set of bit position(s) are unreliable and/or otherwise may fail to properly store data under expected operating conditions.

Figure 5:
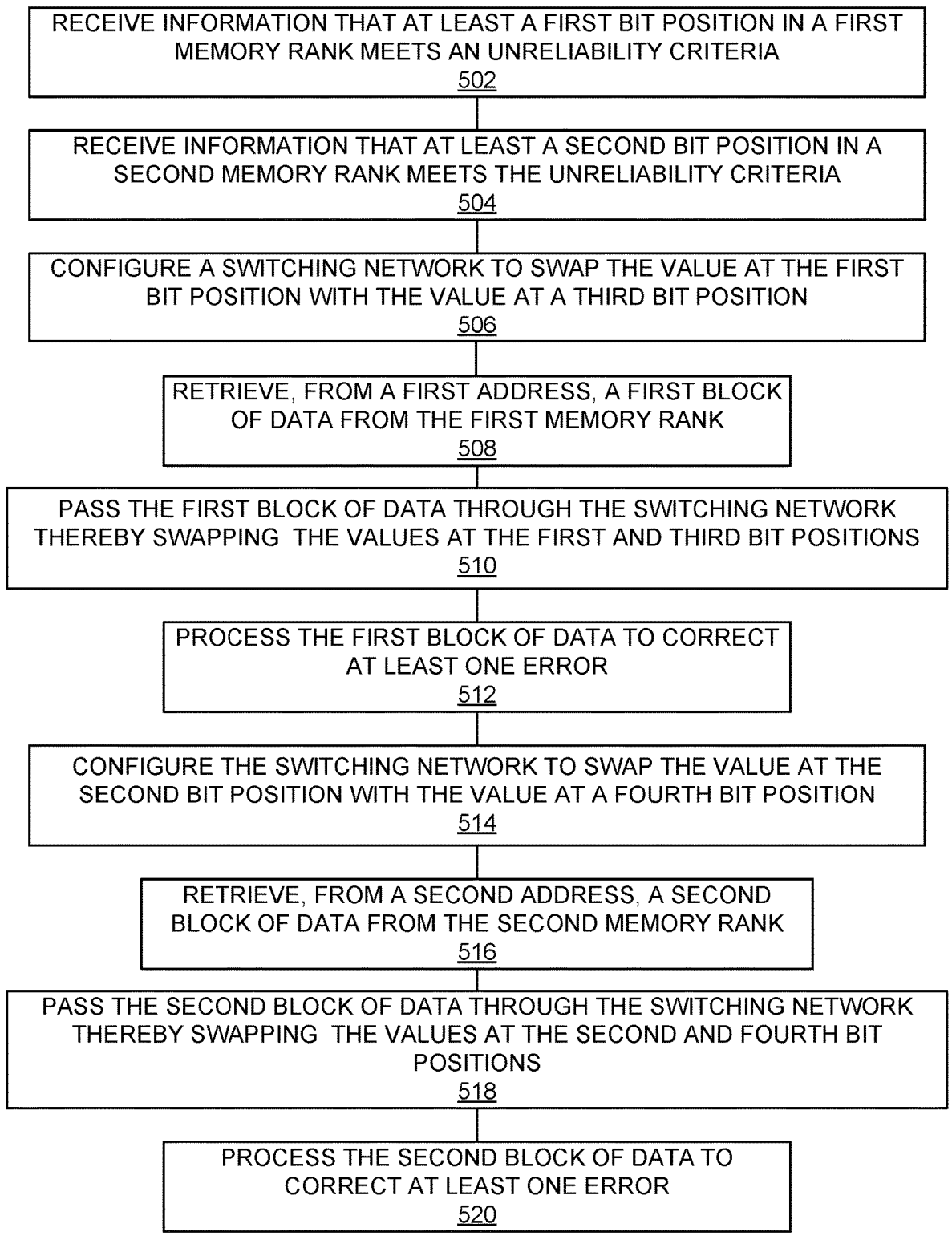
FIG. 5 is a flowchart illustrating a method of retrieving error coalescing codewords on a per rank basis.

FIG. 5 is a flowchart illustrating a method of retrieving error coalescing codewords on a per rank basis. The steps illustrated in FIG. 5 may be performed by, for example, one or more elements of system 100, and/or system 200. Information that at least a first bit position in a first memory rank meets an unreliability criteria is received (502). For example, host 150 and/or controller 110 may test a first rank of memory during initialization and determine that storage cells corresponding to a first set of bit position(s) that are unreliable and/or otherwise may fail to properly store data under expected operating conditions. In another example, host 150 may query a first rank of memory (e.g., using mode register set commands and/or using a serial presence detect channel) and receive information that indicates storage cells corresponding to the first set of bit position(s) are unreliable and/or otherwise may fail to properly store data under expected operating conditions. In another example, the information may be in the form of host 150 and/or controller 110's control of configuration circuitry 126 to swap certain bits when reading and writing to memory 120 and/or a given rank of memory 120.

Information that at least a second bit position in a second memory rank meets the unreliability criteria is received (504). For example, host 150 and/or controller 110 may test a second rank of memory during initialization and determine that storage cells corresponding to a second set of bit position(s) are unreliable and/or otherwise may fail to properly store data under expected operating conditions. In another example, host 150 may query a second rank of memory (e.g., using mode register set commands and/or using a serial presence detect channel) and receive information that indicates storage cells corresponding to the second set of bit position(s) are unreliable and/or otherwise may fail to properly store data under expected operating conditions. In another example, host 150 and/or controller 110 may control configuration circuitry 126 to swap the second set of bit position(s) with other bit positions when reading and writing to a first rank of memory.

A switching network is configured to swap the value at the first bit position with the value at a third bit position (506). For example, when reading from a first rank of memory, coalescing logic 125 may be configured to swap the values at a first set of bit position(s) in a rearranged codeword with other values in the rearranged codeword. The first set of bit position(s) may correspond to bit positions in the first rank that have been determined (or have been deemed) to be unreliable. This swapping of the values at the first set of bit position(s) may undo a placement of the values that are going to be stored in unreliable bit positions of the first rank into the same (e.g., check) symbol.

From a first address, a first block of data is retrieved from the first memory rank (508). For example, controller 110 may receive, via interface 128, a first rearranged codeword (e.g., codeword 203). The first block of data is passed through the switching network thereby swapping the values at the first and third bit positions (510). For example, the first rearranged codeword (e.g., codeword 203) may be passed through coalescing logic 125 to produce a first original format codeword (e.g., codeword 204) with un-rearranged bit positions.

The first block of data is processed to correct at least one error (512). For example, the first original format codeword (e.g., codeword 204) may processed by EDC circuitry 122 to detect and/or correct errors.

The switching network is configured to swap the value at the second bit position with the value at a fourth bit position (514). For example, when reading from a second rank of memory, coalescing logic 125 may be configured to swap the values at a second set of bit position(s) in a rearranged codeword with other values in the rearranged codeword. The second set of bit position(s) may correspond to bit positions in the second rank that have been determined (or have been deemed) to be unreliable. This swapping of the values at the second set of bit position(s) may undo a placement of the values that are going to be stored in unreliable bit positions of the second rank into the same (e.g., check) symbol.

From a second address, a second block of data is retrieved from the second memory rank (516). For example, controller 110 may receive, via interface 128, a second rearranged codeword (e.g., codeword 207). The second block of data is passed through the switching network thereby swapping the values at the second and fourth bit positions (518). For example, the second rearranged codeword (e.g., codeword 207) may be passed through coalescing logic 125 to produce a second original format codeword (e.g., codeword 208) with un-rearranged bit positions.

The second block of data is processed to correct at least one error (512). For example, the second original format codeword (e.g., codeword 208) may processed by EDC circuitry 122 to detect and/or correct errors.

Figure 6:
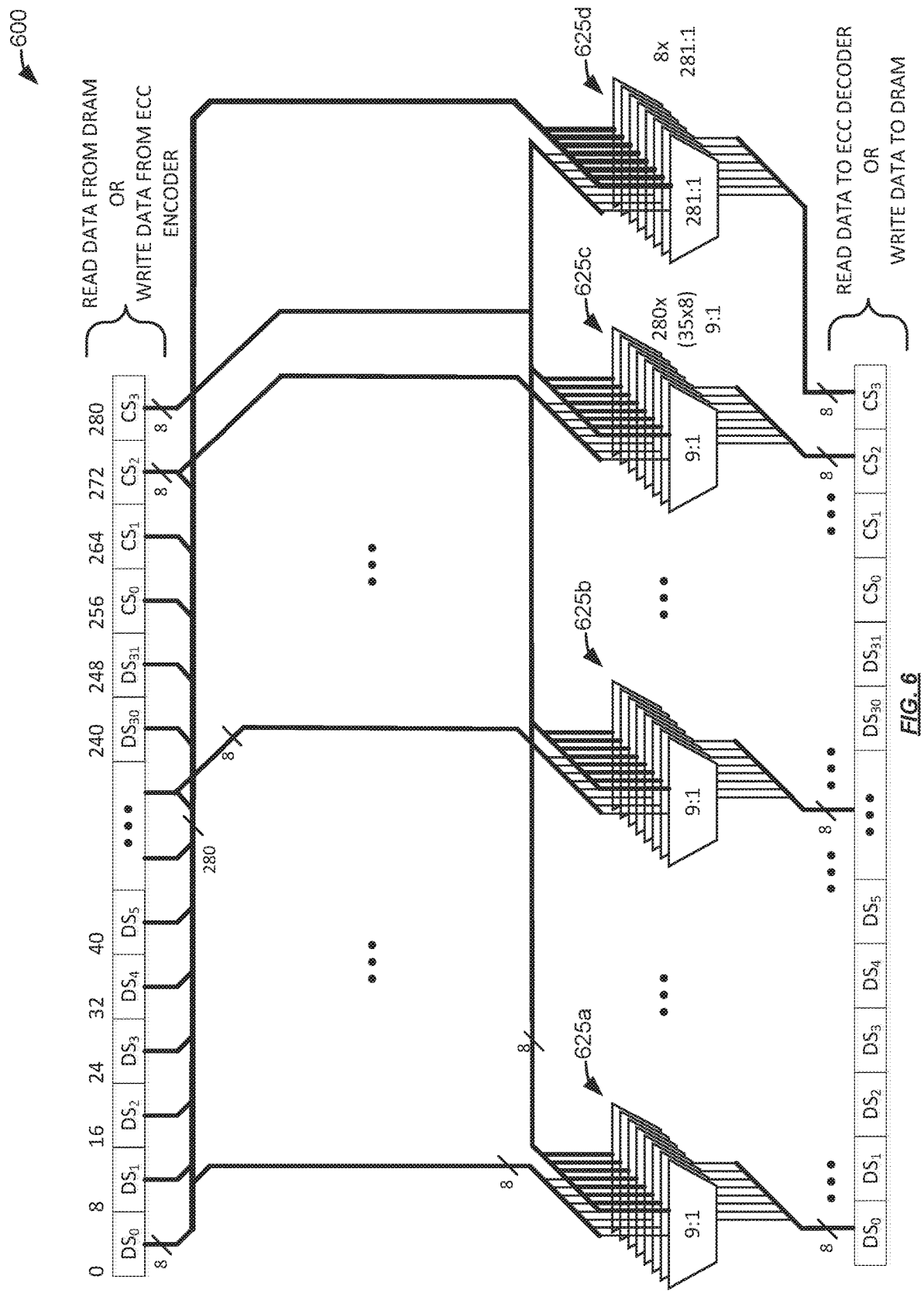
FIG. 6 is a block diagram illustrating example error coalescing logic.

FIG. 6 is a block diagram illustrating example error coalescing logic. Coalescing logic 125 and/or coalescing logic 225 may be or comprise coalescing logic 600. In FIG. 6, coalescing logic 600 comprises 9:1 MUXs 625*a*-625*c* and 281:1 MUXs 625*d*. The 280 9:1 MUXs 625*a*-625*c* select either a value at a specific bit position in the input codeword (e.g., read data from memory 120 or write data from EDC circuitry 122) that does not include the bit positions associated with $CS_3$, or a value from one of the eight (8) bit positions that are part of a single check symbol ($CS_3$), and places that value at the corresponding specific bit position in the output codeword (e.g., read data to EDC circuitry 122 or write data destined for memory 120). The eight (8) 281:1 MUXs 625*d* select either a value at a specific bit position associated with $CS_3$ in the input codeword or a value from one of the 281 bit positions that are part of the codeword that does not include $CS_3$, and places that value at the corresponding specific bit position in $CS_3$ of the output codeword.

Figure 7:
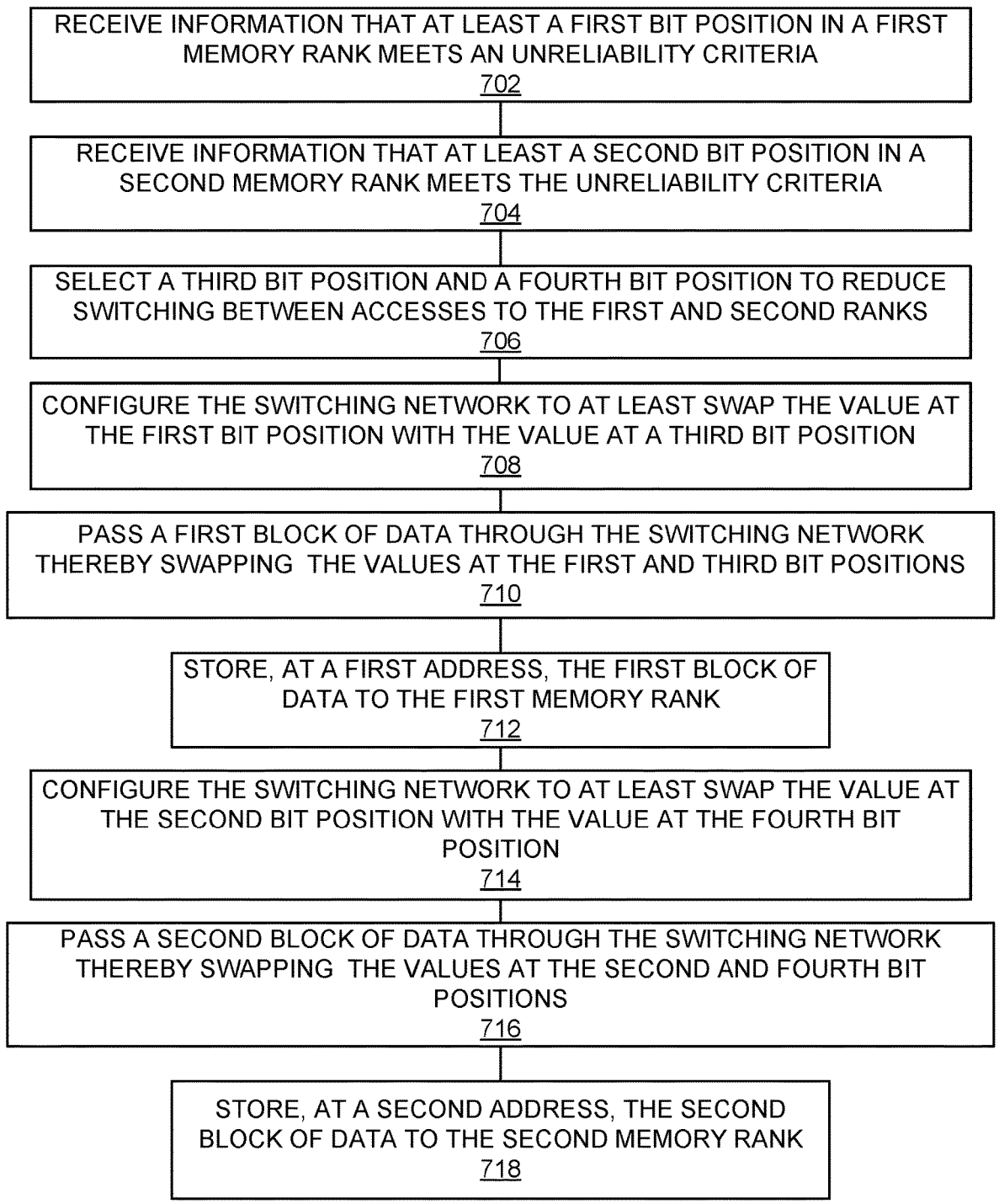
FIG. 7 is a flowchart illustrating a method of configuring error coalescing logic.

FIG. 7 is a flowchart illustrating a method of configuring error coalescing logic. The steps illustrated in FIG. 7 may be performed by, for example, one or more elements of system 100, and/or system 200. Information that at least a first bit position in a first memory rank meets an unreliability criteria is received (702). For example, host 150 and/or controller 110 may receive information during initialization that deems storage cells corresponding to a first set of bit position(s) in a first memory rank as unreliable and/or otherwise meet a threshold probability for failing to properly store data under expected operating conditions. Information that at least a second bit position in a second memory rank meets an unreliability criteria is received (702). For example, host 150 and/or controller 110 may receive information during initialization that deems storage cells corresponding to a second set of bit position(s) in a second memory rank as unreliable and/or otherwise meet a threshold probability for failing to properly store data under expected operating conditions.

A third bit position and a fourth bit position are selected to reduce switching between accesses to the first and second ranks (706). For example, if the first bit position and the second bit position are the only unreliable bit positions across all of the memory ranks, the third bit position and the fourth bit positions could be selected to be different bits in the same (e.g., check) symbol. This would allow the switching network (e.g., coalescing logic 125) to remain static (e.g., not switch at all) regardless of whether the first rank or the second rank is being accessed. In another example, if the first bit position and the second bit position are the same, the third bit position and the fourth bit position could be selected to be the same bit position in the same (e.g., check) symbol. This would allow the MUXs (and/or crossbar switching elements) directing the values from the first (and second— since they are the same) bit position to the third bit position to remain static regardless of whether the first rank or the second rank is being accessed—thereby reducing switching power. Other optimizations (e.g., involving additional ranks, etc.) are contemplated.

A switching network is configured to at least swap the value at the first bit position with the value at a third bit position (708). For example, when writing to a first rank of memory, coalescing logic 125 may be configured to swap the values at a first set of bit position(s) in the data symbol fields with the values at selected bit positions in a single check symbol field.

The first block of data is passed through the switching network thereby swapping the values at the first and third bit positions (710). For example, the first codeword (e.g., codeword 201) may be passed through coalescing logic 125 to produce a first rearranged codeword (e.g., codeword 202) with the values at a first set of bit position(s) in the data symbol fields swapped with the values at selected bit positions in a single check symbol field.

At a first address, the first block of data is stored to the first memory rank (712). For example, the first rearranged codeword (e.g., codeword 202) may be stored to a first memory rank that has storage cells corresponding to the first set of bit position(s) are unreliable and/or otherwise may fail to properly store data under expected operating conditions.

The switching network is configured to swap at least the value at the second bit position with the value at a fourth bit position (714). For example, when writing to a second rank of memory, coalescing logic 125 may be configured to swap the values at a second set of bit position(s) (which may be different or the same as the first set of bit positions) in the data symbol fields with the values at selected bit positions in the single check symbol field.

The second block of data is passed through the switching network thereby swapping the values at the second and fourth bit positions (716). For example, the second codeword may be passed through coalescing logic 125 to produce a rearranged second codeword with the values at a second set of bit position(s) in the data symbol fields swapped with the values at selected bit positions in the single check symbol field.

At a second address, the second block of data is stored to the second memory rank (720). For example, the rearranged second codeword may be stored to a second memory rank that has storage cells corresponding to the second set of bit position(s) are unreliable and/or otherwise may fail to properly store data under expected operating conditions.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 200, and/or coalescing logic 600, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of system 100, system 200, and/or coalescing logic 600, and their components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

Implementations discussed herein include, but are not limited to, the following examples:

Example 1: A memory controller, comprising: first data steering circuitry to receive a first codeword comprising a first plurality of data symbol locations and a second plurality of check symbol locations, the first data steering circuitry to exchange at least one bit location in a check symbol location with a corresponding respective at least one bit location in a data symbol location to form a first error coalesced codeword, the first data steering circuitry to output the first error coalesced codeword.

Example 2: The memory controller of example 1, further comprising circuitry to store the first error coalesced codeword in a memory component.

Example 3: The memory controller of example 1, further comprising: circuitry to receive a second error coalesced codeword from the memory component.

Example 4: The memory controller of example 3, further comprising: second data steering circuitry to receive the second error coalesced codeword, the second data steering circuitry to exchange the at least one bit location in a check symbol location with the corresponding respective at least one bit location in the data symbol location to form a second codeword comprising the first plurality of data symbol locations and the second plurality of check symbol locations, the second data steering circuitry to output the second codeword.

Example 5: The memory controller of example 4, further comprising: error detection and correction circuitry to process the second codeword to determine whether there is at least one error in the second codeword.

Example 6: The memory controller of example 5, wherein the error detection and correction circuitry processes the second codeword with the check symbol location as erased.

Example 7: The memory controller of example 6, wherein the error detection and correction circuitry processes the second codeword to correct at least one error in the second codeword.

Example 8: A memory controller, comprising: first data steering logic to coalesce errors from a plurality of bit locations within a plurality of data symbol fields of a first codeword that have been determined to meet an unreliability criteria, the error to be coalesced into a corresponding plurality of bit locations within a single check symbol field of the first codeword to produce an error coalesced codeword.

Example 9: The memory controller of example 8, further comprising: circuitry to store the first error coalesced codeword in a memory component.

Example 10: The memory controller of example 9, further comprising: circuitry to receive a second error coalesced codeword from the memory component.

Example 11: The memory controller of example 10, further comprising: second data steering logic to reverse the coalescing of errors from the plurality of bit locations within the plurality of data symbol fields to the corresponding plurality of bit locations within a single check symbol field of the second error coalesced codeword to produce a second codeword.

Example 12: The memory controller of example 11, further comprising: error detection and correction circuitry to process the second codeword to determine whether there is at least one error in the second codeword.

Example 13: The memory controller of example 12, wherein the error detection and correction circuitry processes the second codeword with the check symbol location as erased.

Example 14: The memory controller of example 13, wherein the error detection and correction circuitry processes the second codeword to correct at least one error in the second codeword.

Example 15: A method of operating a memory controller, comprising: receiving information indicating one or more bit positions in a memory rank meet an unreliability criteria; receiving a first block of data comprising a plurality of data fields and a plurality of check fields; before storing the block of data to the memory rank, swapping the values at the one or more bit positions with respective selected bit positions in a single check field of the plurality of check fields; and, storing the block of data to the memory rank at an address.

Example 16: The method of example 15, further comprising: Example receiving, from the memory rank and from the address, a second block of data corresponding to a stored version of the first block of data; and, swapping the values at the respective selected bit positions in the single check field of the second block of data with the values at the one or more bit positions of the second block of data to form a third block of data that has a plurality of data fields and a plurality of check fields that correspond to the plurality of data fields and the plurality of check fields of the first block of data.

Example 17: The method of example 16, further comprising: processing, using the check fields of the third block of data, the third block of data to determine whether bits in the third block of data are different from the first block of data.

Example 18: The method of example 17, wherein the processing treats at least one bit in the single check field as erased.

Example 19: The method of example 17, further comprising: processing, using the check fields of the third block of data, the third block of data to correct bits in the third block of data that are different from the first block of data.

Example 20: The method of example 19, wherein the plurality of check fields are generated from the plurality of data fields according to a symbol based error detection and correction type code.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory controller, comprising:
   circuitry to configure first data steering circuitry to exchange at least one bit location in a check symbol location with a corresponding respective at least one bit location in a data symbol location to form a first error coalesced codeword, the first data steering circuitry to output the first error coalesced codeword.

2. The memory controller of claim 1, further comprising circuitry to cause the first error coalesced codeword to be stored in a memory component.

3. The memory controller of claim 2, wherein the memory component includes data buffer devices comprising at least a portion of the first data steering circuitry.

4. The memory controller of claim 2, wherein the memory component comprises non-volatile memory to store information used to configure the first data steering circuitry.

5. The memory controller of claim 1, further comprising:
   circuitry to configure second data steering circuitry to exchange the least one bit location in the check symbol location with the corresponding respective at least one bit location in the data symbol location to form a second codeword, the second data steering circuitry to output the second codeword.

6. The memory controller of claim 5, further comprising:
   error detection and correction circuitry to process the second codeword to determine whether there is at least one error in the second codeword.

7. The memory controller of claim 6, wherein the error detection and correction circuitry processes the second codeword with the check symbol location treated as erased.

8. A memory controller, comprising:
   circuitry to configure first data steering logic to coalesce errors from a plurality of bit locations within a plurality of data symbol fields of a first codeword that have been determined to meet an unreliability criteria, the errors to be coalesced into a corresponding plurality of bit locations within a single check field of the first codeword to produce an error coalesced codeword.

9. The memory controller of claim 8, further comprising:
   circuitry to cause the error coalesced codeword to be stored in a memory component.

10. The memory controller of claim 9, wherein the memory component includes data buffer devices comprising at least a portion of the first data steering logic.

11. The memory controller of claim 9, wherein the memory component comprises non-volatile memory to store information used to configure the first data steering logic.

12. The memory controller of claim 8, further comprising:
    circuitry to configure second data steering logic to reverse coalescing of the errors from the plurality of bit locations within the plurality of data symbol fields to the corresponding plurality of bit locations within the single check field of error coalesced codewords to produce a second codeword.

13. The memory controller of claim 12, further comprising:
    error detection and correction circuitry to process the second codeword to determine whether there is at least one error in the second codeword.

14. The memory controller of claim 13, wherein the error detection and correction circuitry processes the second codeword with the single check field treated as erased.

15. A method, comprising:
receiving information indicating one or more bit positions in a memory rank meet an unreliability criteria;
configuring first steering circuitry to swap values at the one or more bit positions with respective selected bit positions in a single check field of a plurality of check fields in blocks of data comprising a plurality of data fields and a plurality of check fields;
providing a first block of data comprising the plurality of data fields and the plurality of check fields to the first steering circuitry to produce a first error coalesced block of data; and
storing the first error coalesced block of data in the memory rank at an address.

16. The method of claim 15, further comprising:
configuring second steering circuitry to swap values at the respective selected bit positions in the single check field of the plurality of check fields in the blocks of data to produce data blocks comprising the plurality of data fields and the plurality of check fields;
receiving, from the memory rank and associated with the address, a second error coalesced block of data corresponding to a stored version of the first error coalesced block of data; and
providing the second error coalesced block of data to the second steering circuitry to produce a second block of data comprising the plurality of data fields and the plurality of check fields.

17. The method of claim 16, further comprising:
processing, using the plurality of check fields of the second block of data, the second block of data to determine whether bits in the second block of data are different from the first block of data.

18. The method of claim 17, wherein the processing treats at least one bit in the single check field as erased.

19. The method of claim 17, further comprising:
processing, using the plurality of check fields of the second block of data, the second block of data to correct bits in the second block of data that are different from the first block of data.

20. The method of claim 19, wherein the plurality of check fields are generated according to a symbol based error detection and correction type code.

* * * * *